(12) United States Patent
Anderson et al.

(10) Patent No.: US 8,377,780 B2
(45) Date of Patent: Feb. 19, 2013

(54) TRANSISTORS HAVING STRESSED CHANNEL REGIONS AND METHODS OF FORMING TRANSISTORS HAVING STRESSED CHANNEL REGIONS

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 12/886,639

(22) Filed: Sep. 21, 2010

(65) Prior Publication Data

US 2012/0068233 A1    Mar. 22, 2012

(51) Int. Cl.
*H01L 21/336* (2006.01)

(52) U.S. Cl. ............ 438/285; 438/300; 257/E29.193

(58) Field of Classification Search .......... 438/285, 438/300; 257/E29.193
See application file for complete search history.

(56) References Cited

U.S. PATENT DOCUMENTS

| | | | |
|---|---|---|---|
| 7,102,201 B2 * | 9/2006 | Furukawa et al. ............ 257/382 |
| 7,329,571 B2 | 2/2008 | Hoentschel et al. | |
| 7,407,860 B2 * | 8/2008 | Kim et al. ............ 438/300 |
| 2005/0266631 A1 * | 12/2005 | Kim et al. ............ 438/216 |
| 2006/0011990 A1 * | 1/2006 | Furukawa et al. ............ 257/377 |
| 2006/0138398 A1 * | 6/2006 | Shimamune et al. ........... 257/19 |
| 2006/0286730 A1 * | 12/2006 | Liu et al. ............ 438/197 |
| 2006/0289900 A1 | 12/2006 | Thirupapuliyur et al. | |
| 2007/0096194 A1 | 5/2007 | Streck et al. | |
| 2007/0132038 A1 | 6/2007 | Chong et al. | |
| 2007/0228482 A1 | 10/2007 | Wei et al. | |
| 2008/0006884 A1 * | 1/2008 | Yagishita ............ 257/384 |
| 2008/0119031 A1 * | 5/2008 | Pal et al. ............ 438/483 |
| 2008/0142879 A1 | 6/2008 | Chong et al. | |
| 2009/0032840 A1 * | 2/2009 | Gluschenkov et al. ........ 257/190 |
| 2009/0085125 A1 * | 4/2009 | Kim et al. ............ 257/369 |
| 2009/0242995 A1 * | 10/2009 | Suzuki et al. ............ 257/368 |
| 2009/0250771 A1 * | 10/2009 | Miyamura ............ 257/402 |

* cited by examiner

*Primary Examiner* — Jarrett Stark
(74) *Attorney, Agent, or Firm* — Schmeiser, Olsen & Watts; Richard Kotulak (57) ABSTRACT

A method of forming a field effect transistor and a field effect transistor. The method includes (a) forming gate stack on a silicon layer of a substrate; (b) forming two or more SiGe filled trenches in the silicon layer on at least one side of the gate stack, adjacent pairs of the two or more SiGe filled trenches separated by respective silicon regions of the silicon layer; and (c) forming source/drains in the silicon layer on opposite sides of the gate stack, the source/drains abutting a channel region of the silicon layer under the gate stack.

30 Claims, 6 Drawing Sheets

TRANSISTORS HAVING STRESSED CHANNEL REGIONS AND METHODS OF FORMING TRANSISTORS HAVING STRESSED CHANNEL REGIONS

FIELD OF THE INVENTION

The present invention relates to the field of transistors and method of forming transistors; more specifically, it relates to transistors having stressed channel regions and method of fabricating transistors having stressed channel regions.

BACKGROUND OF THE INVENTION

In microelectronic technology there is an ongoing search for transistors with increased performance. While many methods exist for increasing transistor performance, new and improved transistor structures with even more performance and methods of fabricating transistor structures with even more performance than currently available are continually sought after. Accordingly, there continues to be an unsatisfied need for transistors with increased performance.

SUMMARY OF THE INVENTION

A first aspect of the present invention is a method, comprising: (a) forming gate stack on a silicon layer of a substrate; (b) forming two or more SiGe filled trenches in the silicon layer on at least one side of the gate stack, adjacent pairs of the two or more SiGe filled trenches separated by respective silicon regions of the silicon layer; and (c) forming source/drains in the silicon layer on opposite sides of the gate stack, the source/drains abutting a channel region of the silicon layer under the gate stack.

A second aspect of the present invention is a structure, comprising: a gate stack on a silicon layer of a substrate; two or more SiGe filled trenches in the silicon layer on at least one side of the gate stack, adjacent pairs of the two or more SiGe filled trenches separated by respective silicon regions of the silicon layer; and source/drains in the silicon layer on opposite sides of the gate stack, the source/drains abutting a channel region of the silicon layer under the gate stack.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Stress is a measure of the average amount of force exerted per unit area. Stress is a measure of the intensity of the total internal forces acting within a body across imaginary internal surfaces, as a reaction to external applied forces and body forces. Strain is the geometrical expression of deformation caused by the action of stress on a physical body.

Silicon-Germanium (SiGe) has an increased crystal lattice spacing compared to silicon alone. By embedding SiGe regions on either side of silicon channel of a field effect transistor (FET) the channel region will be put in compressive stress. In p-channel field effect transistors (PFETs) the mobility of the majority carriers (holes) is greater than (and electron mobility is less) when the channel region is in compressive stress in the direction of current flow. Increasing the mobility of majority carriers increase the performance of the device in terms of both speed and gain. However, as the area of an embedded SiGe region increases (e.g., allowing increased SiGe surface deflection), the strain within the SiGe region decreases, thus reducing the stress on adjacent the silicon channel region.

Figure 1A:
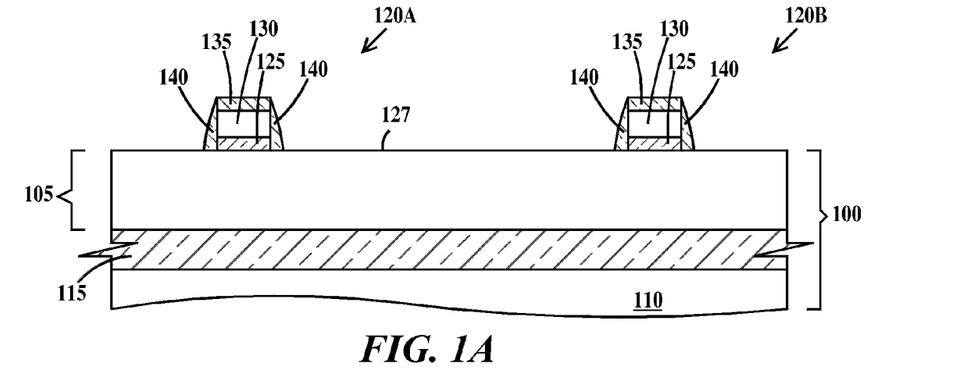
FIGS. 1A through 1F are cross-sectional drawings illustrating fabrication of a stressed transistor according to a first embodiment of the present invention.

FIGS. 1A through 1F are cross-sectional drawings illustrating fabrication of a stressed transistor according to a first embodiment of the present invention. In FIG. 1A, a silicon-on-insulator (SOI) substrate includes a single-crystal silicon layer 105 and a supporting substrate 110 (e.g., single-crystal silicon) separated by a buried oxide (BOX) layer 115. In one example BOX layer 115 comprises silicon dioxide. Formed on silicon layer 105 are first and second gate stacks 120A and 120B. Gate stacks 120A and 120B each comprise a gate dielectric layer 125 on a top surface 127 of silicon layer 105, a gate electrode a 130 on a top surface of gate dielectric layer 125 and a dielectric capping layer 135 on a top surface of gate electrode 130. In one example, gate electrode 135 comprises polysilicon. In one example, capping layer 135 comprises silicon dioxide or silicon nitride. Formed on sidewalls of gate stacks 120A and 120B are dielectric sidewall spacers 140. In one example, sidewall spacers 140 comprise silicon dioxide or silicon nitride.

Figure 1B:
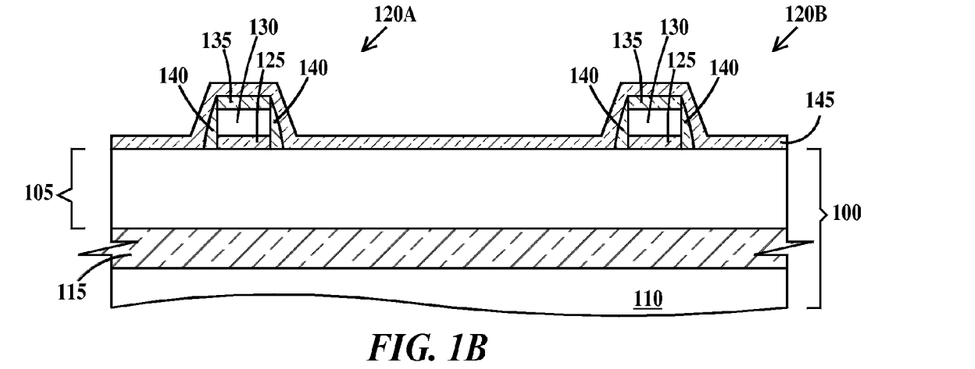

In FIG. 1B, a hardmask layer 145 is formed on exposed surfaces of silicon layer 105, capping layer 135 and sidewall spacers 140. In one example, hardmask layer 145 comprises silicon dioxide or silicon nitride. In one example, hardmask layer 145 is a conformal layer.

Figure 1C:
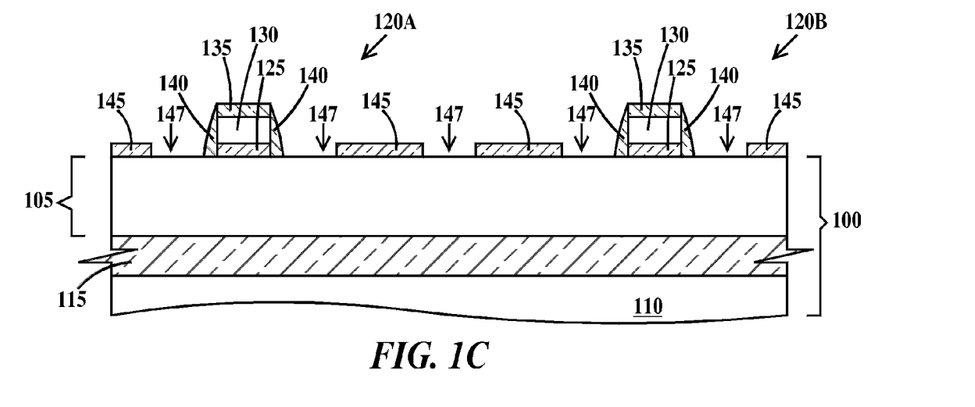
Figure 4A:
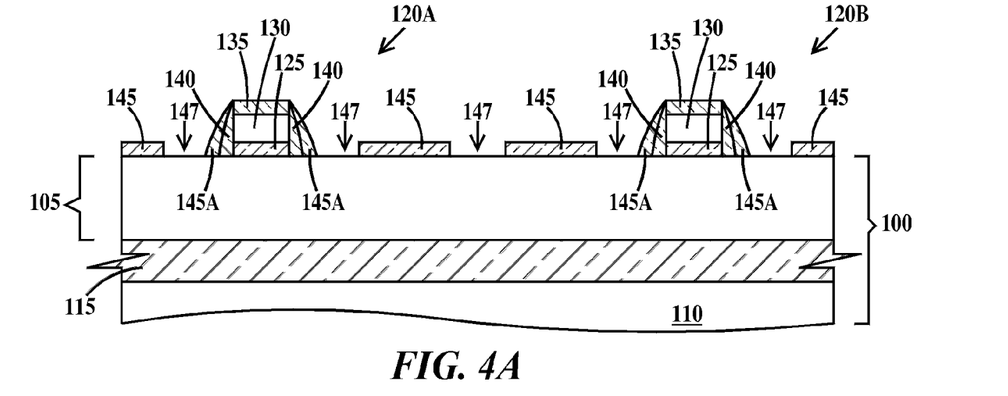
FIGS. 4A and 4B are cross-sectional drawings illustrating alternative process steps applicable to all embodiments of the present invention.

In FIG. 1C, hardmask layer 145 is patterned to form openings 147 through the hardmask layer with regions of silicon layer 105 exposed in openings 147 so there are regions of silicon layer 105 not protected by hardmask layer 145, gate stacks 120A and 120B and sidewall spacers 140. Openings 147 are formed in a photolithographic process followed by a wet or dry etch. An example of a dry etch is a reactive ion etch (RIE). In FIG. 1C, after patterning, hardmask layer 145 has been removed from sidewall spacers 140 and capping layer 135. Depending upon the etch properties of the particular etch process and the materials of capping layer 135, sidewall spacers and 140 hardmask layer 145, it is possible for spacers formed from hardmask layer 145 to be formed on sidewall spacers 140 as illustrated in FIG. 4A and described infra.

A photolithographic process is one in which a photoresist layer is applied to a surface, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After further processing (e.g., an etch or an ion implantation), the patterned photoresist is removed. The photoresist layer may optionally be baked at one or more of the following steps: prior to exposure to actinic radiation, between exposure to actinic radiation and development, after development.

Figure 1D:
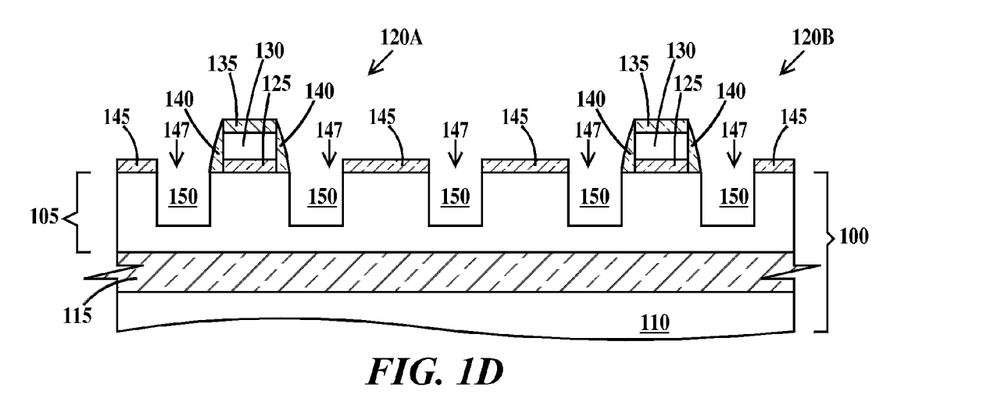
Figure 4B:
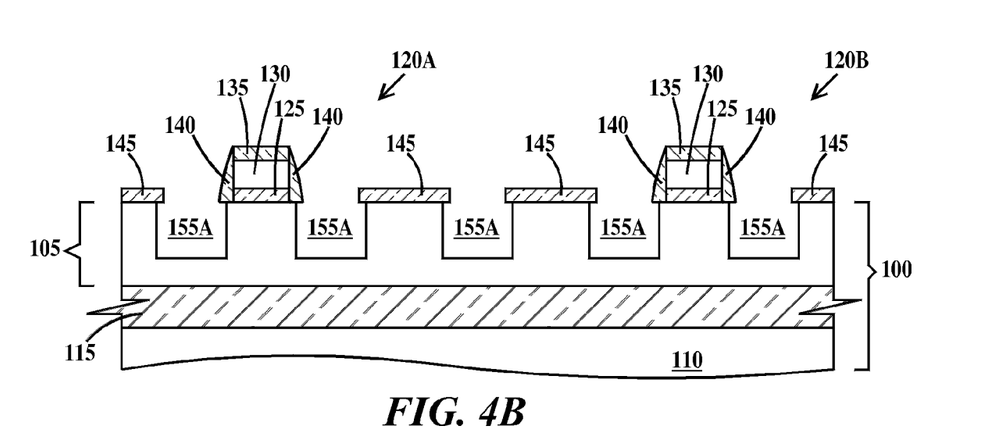

In FIG. 1D, an etch process has been performed to etch trenches 150 into silicon layer 105 wherever silicon layer 105 is exposed by openings 147. In one example, the etch process comprises a wet etch, a plasma etch or a RIE. Gate electrode (s) 130 is protected by capping layer 135 and sidewall spacers 140 from the silicon etching process. In FIG. 1D, the edges of trenches 150 are aligned to the edges of sidewall spacers 140 and openings 147 in hardmask layer 145. Depending upon the chemistry of the etchant, the sidewalls of trenches 150 may extend under edges of sidewall spacers 140 and openings 147 in hardmask layer 145 as illustrated in FIG. 4B and described infra.

Figure 1E:
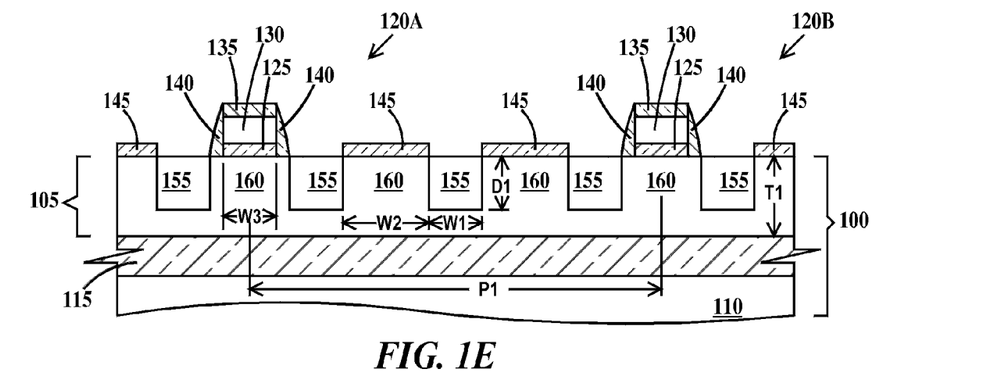
Figure 1F:
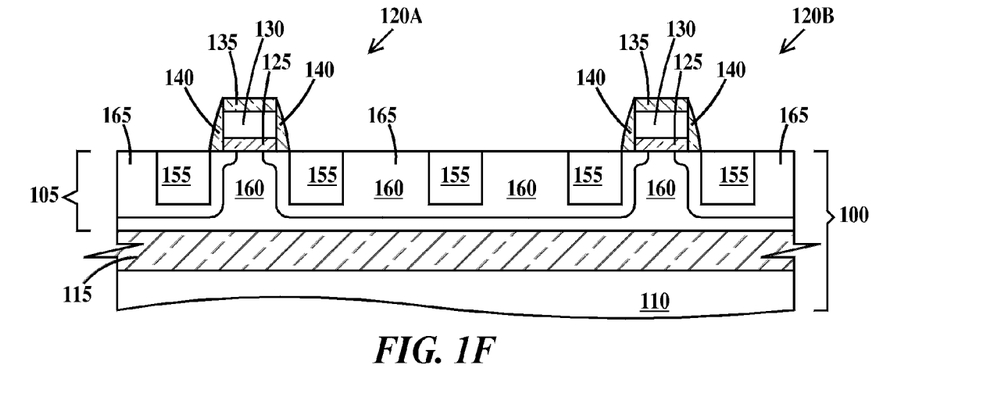

In FIG. 1E, trenches 150 (see FIG. 1D) are filled with SiGe to formed SiGe regions 155 between silicon regions 160. Portions of silicon region 160 under gate electrodes 130 will become the channel regions of FETs as illustrated in FIG. 1F and described infra. The SiGe is selectively grown (e.g., by epitaxial deposition) on silicon layer 105 but not on capping layer 135, sidewall spacers 140 or hardmask layer 145. In FIG. 1E, SiGe regions 155 have a width W1, silicon regions 160 have a width W2 and gate electrodes 130 have a width W3. Gate stacks 120A and 120B are pitched apart a distance P1. In one example W1 is between about 20 nm and about 60 nm, W2 is between about 20 nm and about 60 nm and W3 is between about 20 nm and about 60 nm. W1 may be equal to W2, less than W2 or greater than W2. Silicon layer 105 has a thickness T1 and SiGe regions extend a distance D1 into silicon layer 105. In one example, T1 is between about 120 nm and about 160 nm. In one example, D1 is between about 80 nm and about 100 nm. In one example, T1 is greater than D1. In one example P1 is between about 120 nm and about 200 nm. In FIG. 1E, there are, by way of example, two silicon regions 160 and three SiGe regions 155 between first and second gate stacks 120A and 120B. There may be as few as one silicon region 160 between two SiGe regions 155 or more than two silicon regions 160 between corresponding numbers of SiGe regions 155. It should be understood, that there may be as few as one silicon region 160 between two SiGe regions 155 or more than two silicon regions 160 between corresponding numbers of SiGe regions 155 on both sides of gate stacks 120A and 120B and that the number of silicon regions 160 and SiGe regions 155 need not be the same on opposite sides of either of gate stacks 120A or 120B.

In FIG. 1F, hardmask layer 145 (see FIG. 1E) has been removed and source/drains 165 formed in silicon layer 105 (e.g., by ion implantation). Top surfaces of SiGe regions 155 are essentially coplanar with top surfaces of silicon regions 160. Top surfaces of silicon regions 160 are exposed between adjacent SiGe regions in source/drains 165. Source/drains 165 include silicon regions 160 and SiGe regions 155. While illustrated in FIG. 1F as contained within source/drains 165, SiGe regions 155 may extend through source/drains 165. While illustrated in FIG. 1F as not contacting BOX layer 115, source/drains 165 may abut BOX layer 115. While illustrated in FIG. 1F as not contacting BOX layer 115, SiGe regions 155 may abut BOX layer 115. Gate stacks 120A and 120B may either be separate gates of two different FETs or two gate fingers of a multi-gate FET. SiGe regions 155 exert compressive stress on silicon regions 160. In one example, silicon layer 105 is doped N-type and source/drains 165 are doped P-type. By reducing the surface area of SiGe regions 155 (because of intervening silicon regions 160), the ability for strain relief due to surface deformation is reduced and more stress is induced in the channel region of the FET than in an otherwise identical FET where there are no intervening silicon regions 160.

While an SOI substrate has been illustrated in FIGS. 1A through 1F, the first (and second and third) embodiments of the present invention may be practiced on other semiconductor substrates including conventional bulk silicon substrates (i.e., substrates consisting of solid single-crystal silicon).

Figure 2A:
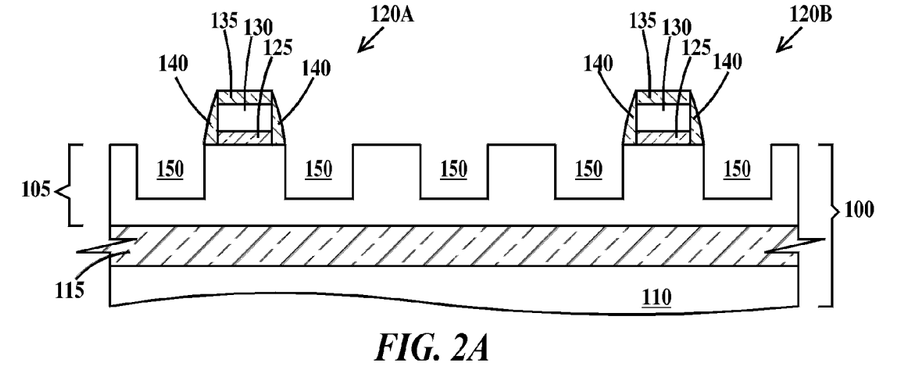
FIGS. 2A through 2C are cross-sectional drawings illustrating fabrication of a stressed transistor according to a second embodiment of the present invention.
Figure 2B:
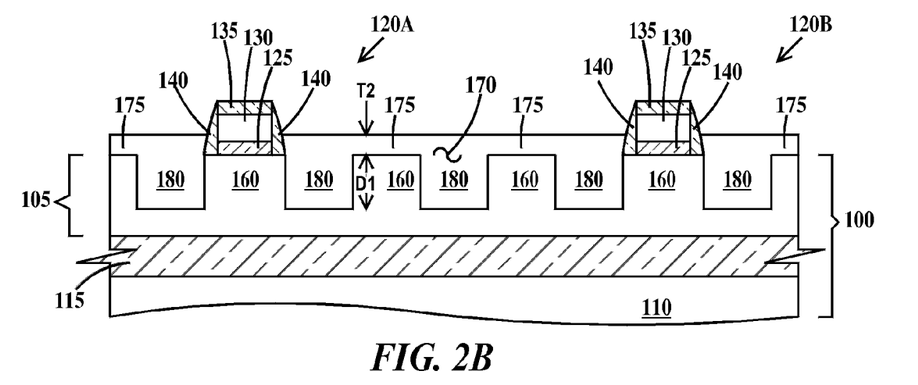
Figure 2C:
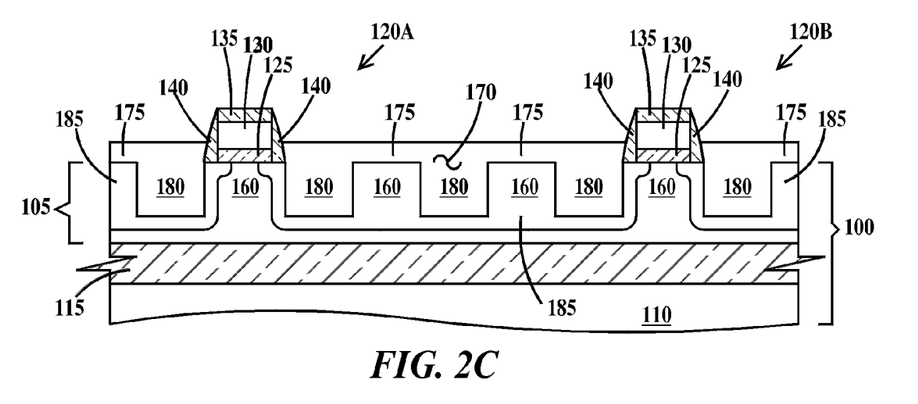

FIGS. 2A through 2C are cross-sectional drawings illustrating fabrication of a stressed transistor according to a second embodiment of the present invention. Prior to the steps illustrated in FIG. 2A, the steps illustrated in FIGS. 1A, 1B, 1C and 1D have been performed. In FIG. 2A, hardmask layer 145 (see FIG. 1D) is removed. Gate electrode(s) 130 are still protected by capping layer 135 and sidewall spacers 140.

In FIG. 2B, trenches 150 (see FIG. 2A) are over filled with SiGe to form SiGe layer 170 having thin SiGe regions 175 over silicon regions 160 and thick SiGe regions 180 between silicon regions 160, thick regions 180 also filling trenches 150 (see FIG. 2A). Thus portions of gate stacks 120A and 120B extend above and below a top surface of SiGe layer 170. In FIG. 2B, there are, by way of example, two silicon regions 160 between first and second gate stacks 120A and 120B. There may be as few as one silicon region 160 between two SiGe regions 180 or more than two silicon regions 160 between corresponding numbers of SiGe regions 180. It should be understood, that there may be as few as one silicon region 160 between two SiGe regions 180 or more than two silicon regions 160 between corresponding numbers of SiGe regions 180 on both sides of gate stacks 120A and 120B and that the number of silicon regions 160 and SiGe regions 180 need not be the same on opposite sides of either of gate stacks 120A or 120B. SiGe regions 175 have a thickness T2. In one example T2 is between about 10 nm and about 40 nm thick. Thus, at least portions of each of gate stacks 120A and 120B are embedded in SiGe layer 170.

In FIG. 2C, source/drains 185 are formed in silicon layer 105 (e.g., by ion implantation). Source/drains 185 include silicon regions 160 and SiGe layer 170. While illustrated in FIG. 2C as contained within source/drains 185, SiGe regions 180 may extend through source/drains 185. While illustrated in FIG. 2C as not contacting BOX layer 115, source/drains 185 may abut BOX layer 115. While illustrated in FIG. 2C as not contacting BOX layer 115, SiGe regions 180 may abut BOX layer 115. Gate stacks 120A and 120B may either be separate gates of two different FETs or two gate fingers of a multi-gate FET. SiGe regions 180 exert compressive stress on silicon regions 160. In one example, silicon layer 105 is doped N-type and source/drains 185 are doped P-type.

Figure 3A:
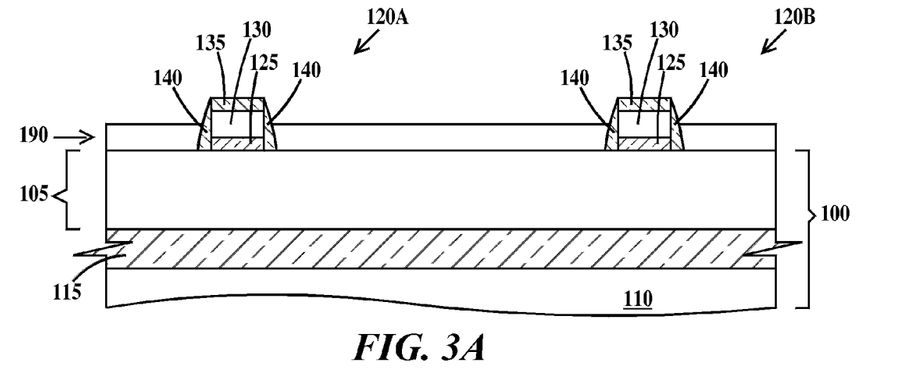
FIGS. 3A through 3F are cross-sectional drawings illustrating fabrication of a stressed transistor according to a third embodiment of the present invention.
Figure 3B:
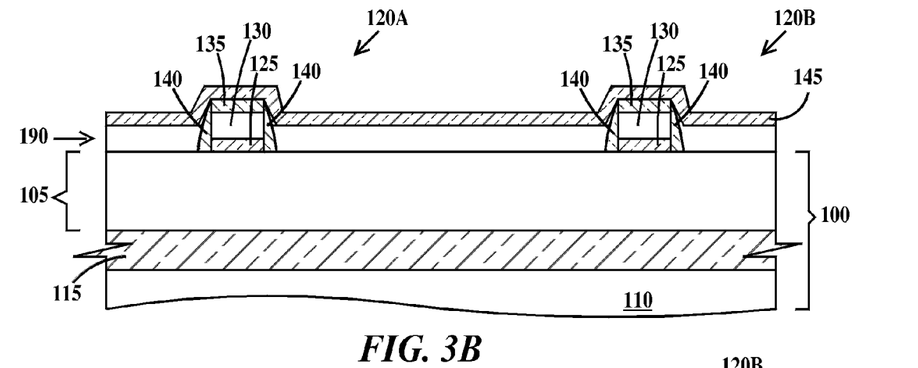
Figure 3C:
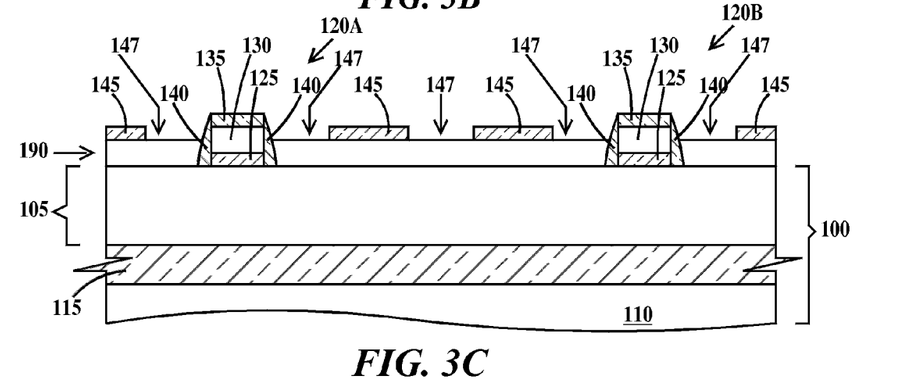
Figure 3D:
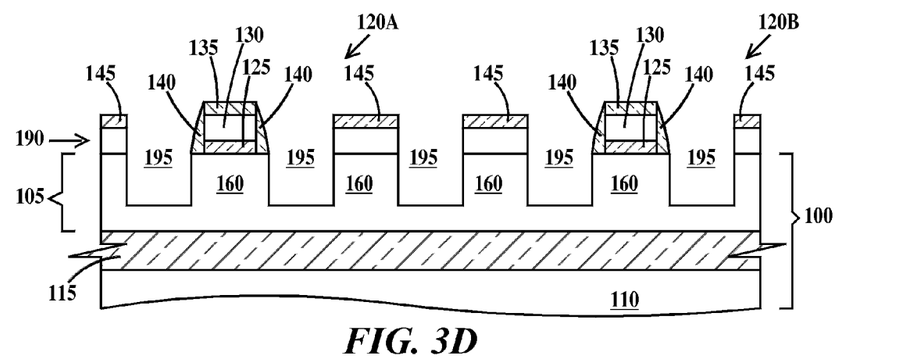
Figure 3E:
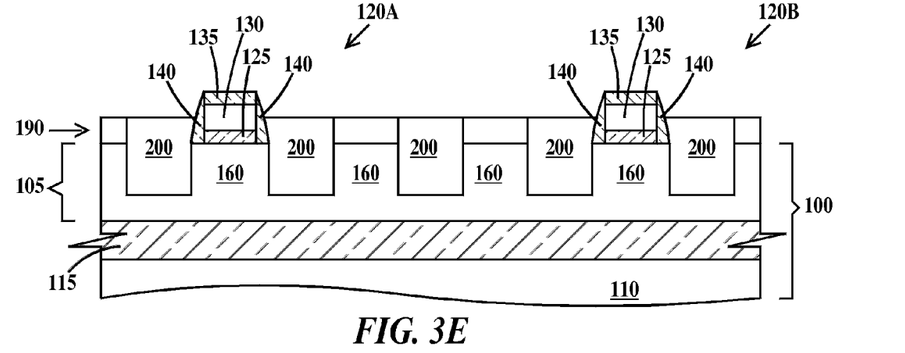
Figure 3F:
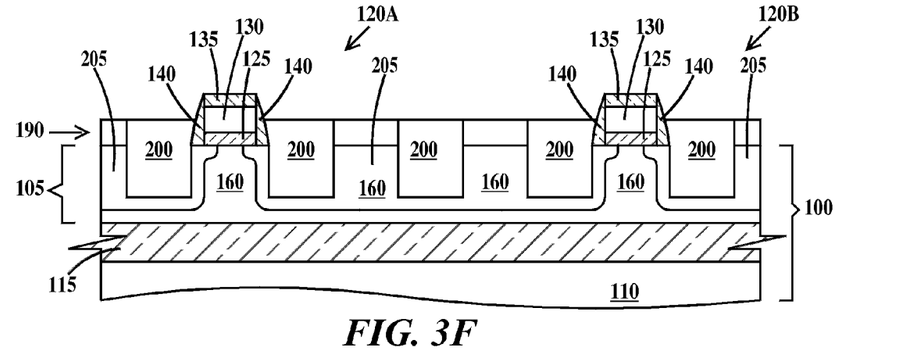

FIGS. 3A through 3F are cross-sectional drawings illustrating fabrication of a stressed transistor according to a third embodiment of the present invention. Prior to the steps illustrated in FIG. 3A, the step illustrated in FIG. 1A has been performed. In FIG. 3A, a single-crystal epitaxial silicon layer 190 has been selectively grown (e.g., by epitaxial deposition) on exposed regions of silicon layer 105, but not on capping layer 135 or sidewall spacers 140. In FIG. 3B, hardmask layer 145 is formed (as described supra with respect to FIG. 1B) on exposed surfaces of epitaxial silicon layer 190, capping layer 135 and sidewall spacers 140. In FIG. 3C, openings 147 are formed in hardmask layer 145 (as described supra with respect to FIG. 1C). In FIG. 3D, trenches 195 are formed (similarly as to trenches 150 of FIG. 1D) through epitaxial silicon layer 190 into silicon layer 105 wherever silicon layer 105 is not protected by hardmask layer 145, gate stacks 120A and 120B and sidewall spacers 140. In FIG. 3E, trenches 195 (see FIG. 3D) are filled with SiGe to formed SiGe regions 200. The SiGe is selectively grown (e.g., by epitaxial deposition) on silicon layers 105 and 190 but not on capping layer 135, sidewall spacers 140 or hardmask layer 145 and hardmask layer 145 (see FIG. 3D) is removed. Thus, at least a portion of each of gate stacks 120A and 120B extends below a surface formed by SiGe regions 200 and remaining regions of epitaxial silicon layer 190. In FIG. 3E, there are, by way of example, two silicon regions 160 between first and second gate stacks 120A and 120B. There may be as few as one silicon region 160 between two SiGe regions 200 or more than two silicon regions 160 between corresponding numbers of SiGe regions 200. It should be understood, that there may be as few as one silicon region 160 between two SiGe regions 200 or more than two silicon regions 160 between corresponding numbers of SiGe regions 200 on both sides of gate stacks 120A and 120B and that the number of silicon regions 160 and SiGe regions 200 need not be the same on opposite sides of either of gate stacks 120A or 120B. In FIG. 3F, source/drains 205 formed in silicon layer 105 (e.g., by ion implantation). Source/drains 205 include regions of silicon layers 105 and 190 and SiGe regions 200. While illustrated in FIG. 3F as contained within source/drains 205, SiGe regions 200 may extend through source/drains 205. While illustrated in FIG. 3F as not contacting BOX layer 115, source/drains 205 may abut BOX layer 115. While illustrated in FIG. 3F as not contacting BOX layer 115, SiGe regions 200 may abut BOX layer 115. Gate stacks 120A and 120B may either be separate gates of two different FETs or two fingers of a multi-gate FET.

FIGS. 4A and 4B are cross-sectional drawings illustrating alternative process steps applicable to all embodiments of the present invention. In FIG. 4A, after etching hardmask layer 145 to form openings 147, sidewall spacers 145A (remnants of the hardmask layer 145 on sidewall spacers 140) are formed on sidewall spacers 140. In FIG. 4B, trenches 155A undercut hardmask layer 145 and sidewall spacers 140 because the etch has a small lateral etch rate. If spacers 145A (see FIG. 4A) were formed, then in FIG. 4B, trenches 155A could extend under spacers 145A and not under sidewall spacers 140 or could extend under both spacers 145A and sidewall spacers 140.

Thus, the embodiments of the present invention provide transistors with increased performance and methods of fabricating transistors with increased performance.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) forming gate stack on a silicon layer of a substrate;
   after (a), (b) forming two or more SiGe filled trenches in said silicon layer on at least one side of said gate stack, adjacent pairs of said two or more SiGe filled trenches separated by respective silicon regions of said silicon layer, said SiGe filled regions having a width between about 20 nm and about 60 nm; and
   after (b), (c) forming source/drains in said silicon layer on opposite sides of said gate stack, said source/drains abutting a channel region of said silicon layer under said gate stack.

2. The method of claim 1, (b) further including:
   (i) forming sidewall spacers on sidewalls of said gate stack,
   after (i), (ii) forming a patterned hardmask layer directly on a top surface of said silicon layer;
   after (ii), (iii) etching trenches into said silicon layer where said silicon layer is not protected by said hardmask layer, said gate stacks and said sidewall spacers;
   after (iii), (iv) selectively growing SiGe on all exposed silicon surfaces to fill said trenches and form SiGe regions in said silicon layer; and
   after (iv), (v) completely removing said patterned hardmask layer.

3. The method of claim 2, wherein top surface of said SiGe regions are essentially coplanar with top surfaces of said silicon regions.

4. The method of claim 2, wherein top surfaces of said silicon regions and said SiGe regions are exposed in said source/drains.

5. The method of claim 1, wherein (b) includes:
   forming trenches in said silicon layer; and
   selectively growing SiGe on (i) sidewalls of said trenches, (ii) bottoms of said trenches and (iii) a top surfaces of said source/drain regions to overfill said trenches to form a continuous SiGe layer covering on said top surfaces of said source/drain regions.

6. The method of claim 5, wherein portions of said gate stack extend above and below a top surface of said SiGe layer.

7. The method of claim 1, wherein said substrate comprises said silicon layer and a buried oxide layer separating a supporting substrate from said silicon layer.

8. The method of claim 1, wherein top surface of said SiGe filled trenches are essentially coplanar with top surfaces of said silicon regions.

9. The method of claim 1, wherein top surface of said SiGe filled trenches are coplanar with top surfaces of said silicon regions.

10. The method of claim 1, wherein said SiGe filled regions are spaced between about 20 nm and about 60 nm.

11. The method of claim 1, wherein said SiGe filled regions extend from said top surface of said silicon layer into said silicon layer a depth of between about 80 nm and about 100 nm.

12. A method, comprising:
   (a) forming gate stack on a silicon layer of a substrate;
   (b) forming two or more SiGe filled trenches in said silicon layer on at least one side of said gate stack, adjacent pairs of said two or more SiGe filled trenches separated by respective silicon regions of said silicon layer;
   (c) forming source/drains in said silicon layer on opposite sides of said gate stack, said source/drains abutting a channel region of said silicon layer under said gate stack;
   between (a) and (b), (i) forming sidewall spacers on sidewalls of said gate stack and growing an epitaxial silicon layer on said silicon layer; and
   after (i), (b) including:
      (ii) forming a patterned hardmask layer on a top surface of said epitaxial silicon layer;
      after (ii), (iii) etching trenches through said epitaxial silicon layer and into said silicon layer where said epitaxial silicon layer is not protected by said hardmask layer, said gate stacks and said sidewall spacers;
      after (iii), (iv) selectively growing SiGe on all exposed silicon surfaces to fill said trenches and form SiGe regions extending through said epitaxial silicon layer and into said silicon layer; and after (iv), (v) removing said patterned hardmask layer.

13. The method of claim 12, wherein top surfaces of said SiGe regions are essentially coplanar with top surfaces of remaining regions of said epitaxial silicon layer.

14. The method of claim 12, wherein portions of said gate stack extend above and below a top surface of said epitaxial silicon layer.

15. The method of claim 12, wherein said substrate comprises said silicon layer and a buried oxide layer separating a supporting substrate from said silicon layer.

16. A method, comprising:
(a) forming gate stack on a silicon layer of a substrate and sidewall spacers on sidewalls of said gate stack;
after (a), (b) forming an epitaxial silicon layer on said silicon layer, said epitaxial silicon layer abutting said sidewall spacers;
after (b), (c) forming two or more SiGe filled trenches through said epitaxial silicon layer and into said silicon layer on at least one side of said gate stack, adjacent pairs of said two or more SiGe filled trenches separated by respective silicon regions of said silicon layer; and
after (c), (d) forming source/drains in said silicon layer on opposite sides of said gate stack, said source/drains abutting a channel region of said silicon layer under said gate stack.

17. The method of claim 16, wherein top surfaces of said SiGe regions are essentially coplanar with top surfaces of remaining regions of said epitaxial silicon layer.

18. The method of claim 16, wherein portions of said gate stack extend above and below a top surface of said epitaxial silicon layer.

19. The method of claim 16, wherein said substrate comprises said silicon layer and a buried oxide layer separating a supporting substrate from said silicon layer.

20. A method, comprising:
(a) forming gate stack on a silicon layer of a substrate;
after (a), (b) forming two or more SiGe filled trenches in said silicon layer on at least one side of said gate stack, adjacent pairs of said two or more SiGe filled trenches separated by respective silicon regions of said silicon layer, said SiGe filled regions spaced between about 20 nm and about 60 nm apart; and
after (b), (c) forming source/drains in said silicon layer on opposite sides of said gate stack, said source/drains abutting a channel region of said silicon layer under said gate stack.

21. The method of claim 20, (b) further including:
(i) forming sidewall spacers on sidewalls of said gate stack,
after (i), (ii) forming a patterned hardmask layer directly on a top surface of said silicon layer;
after (ii), (iii) etching trenches into said silicon layer where said silicon layer is not protected by said hardmask layer, said gate stacks and said sidewall spacers;
after (iii), (iv) selectively growing SiGe on all exposed silicon surfaces to fill said trenches and form SiGe regions in said silicon layer; and
after (iv), (v) completely removing said patterned hardmask layer.

22. The method of claim 21, wherein top surface of said SiGe regions are essentially coplanar with top surfaces of said silicon regions.

23. The method of claim 21, wherein top surfaces of said silicon regions and said SiGe regions are exposed in said source/drains.

24. The method of claim 20, wherein (b) includes:
forming trenches in said silicon layer; and
selectively growing SiGe on (i) sidewalls of said trenches, (ii) bottoms of said trenches and (iii) a top surfaces of said source/drain regions to overfill said trenches to form a continuous SiGe layer covering on said top surfaces of said source/drain regions.

25. The method of claim 24, wherein portions of said gate stack extend above and below a top surface of said SiGe layer.

26. The method of claim 20, wherein said substrate comprises said silicon layer and a buried oxide layer separating a supporting substrate from said silicon layer.

27. The method of claim 20, wherein top surface of said SiGe filled trenches are essentially coplanar with top surfaces of said silicon regions.

28. The method of claim 20, wherein top surface of said SiGe filled trenches are coplanar with top surfaces of said silicon regions.

29. The method of claim 20, wherein said SiGe filled regions have a width between about 20 nm and about 60 nm.

30. The method of claim 20, wherein said SiGe filled regions extend from said top surface of said silicon layer into said silicon layer a depth of between about 80 nm and about 100 nm.

* * * * *